United States Patent
Liu

(10) Patent No.: US 12,125,896 B2
(45) Date of Patent: Oct. 22, 2024

(54) SEMICONDUCTOR DEVICE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yang Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 626 days.

(21) Appl. No.: 17/335,349

(22) Filed: Jun. 1, 2021

(65) Prior Publication Data

US 2022/0005940 A1 Jan. 6, 2022

(30) Foreign Application Priority Data

Jul. 6, 2020 (CN) .......................... 202010642687.4

(51) Int. Cl.
*H01L 29/66* (2006.01)
*H01L 21/285* (2006.01)
*H01L 21/768* (2006.01)
*H01L 23/535* (2006.01)
*H01L 29/45* (2006.01)
*H01L 29/78* (2006.01)

(52) U.S. Cl.
CPC .. *H01L 29/66515* (2013.01); *H01L 21/28518* (2013.01); *H01L 21/76895* (2013.01); *H01L 23/535* (2013.01); *H01L 29/45* (2013.01); *H01L 29/66545* (2013.01); *H01L 29/66795* (2013.01); *H01L 29/7851* (2013.01)

(58) Field of Classification Search
CPC ............... H01L 29/66515; H01L 29/45; H01L 29/66545; H01L 29/66795; H01L 29/7851; H01L 29/66803; H01L 29/42356; H01L 29/785; H01L 29/66606; H01L 29/66871; H01L 29/66583; H01L 29/6681; H01L 21/28518; H01L 21/76895; H01L 21/28141; H01L 23/535; H01L 2224/03011; H01L 2224/11011; H01L 2224/27011; H01L 27/3223
See application file for complete search history.

(56) References Cited

U.S. PATENT DOCUMENTS 9,818,875 B1 * 11/2017 Bi ..................... H01L 29/41791
2007/0018254 A1 1/2007 Yoo et al.
(Continued)

*Primary Examiner* — Cuong B Nguyen
*Assistant Examiner* — Anthony A Pulatov
(74) *Attorney, Agent, or Firm* — Anova Law Group, PLLC

(57) ABSTRACT

A semiconductor device and a forming method thereof are provided. The forming method includes forming an initial dummy gate structure on a substrate. The initial dummy gate structure extends along a first direction. The forming method also includes forming a source/drain doped layer in the substrate on two sides of the initial dummy gate structure, forming an initial conductive layer on the source/drain doped layer and covering a sidewall and a top surface of the source/drain doped layer, and after forming the initial conductive layer, removing the initial dummy gate structure.

11 Claims, 9 Drawing Sheets

(56) References Cited

U.S. PATENT DOCUMENTS

| | | | |
|---|---|---|---|
| 2016/0079124 A1* | 3/2016 | Yin | H01L 21/266 |
| | | | 438/283 |
| 2016/0126326 A1 | 5/2016 | Park et al. | |
| 2016/0343857 A1* | 11/2016 | Colinge | H01L 21/02592 |
| 2017/0141199 A1 | 5/2017 | Demuynck et al. | |
| 2019/0067436 A1* | 2/2019 | Wu | H01L 29/456 |
| 2020/0020592 A1 | 1/2020 | Wang | |
| 2021/0391184 A1* | 12/2021 | Huang | H01L 21/823475 |

\* cited by examiner

SEMICONDUCTOR DEVICE AND FORMING METHOD THEREOF

CROSS-REFERENCE TO RELATED APPLICATION

This application claims priority of Chinese Patent Application No. 202010642687.4, filed on Jul. 6, 2020, the entire content of which is hereby incorporated by reference.

FIELD OF THE DISCLOSURE

The present disclosure generally relates to the field of semiconductor manufacturing and, more particularly, relates to a semiconductor device and a forming method thereof.

BACKGROUND

With rapid development of semiconductor manufacturing technology, semiconductor devices are advancing towards a higher component density and a higher integration level. As an example, a flash memory may be used as a storage device in an electronic device such as a digital camera, a notebook computer, or a tablet computer.

Accordingly, reducing a size of a flash memory unit and thereby reducing a cost of a flash memory is one of directions of technological development. For an electrically erasable NOR flash memory with a tunnel oxide layer, a self-align contact process may be used to fabricate a conductive structure of a surface of a source/drain region, such that demand for making a flash memory with a smaller size may be met.

However, even if a self-align contact process is used to fabricate a conductive structure of a surface of a source region/drain region, performance of a semiconductor structure formed still needs to be improved. The disclosed structures and methods are directed to solve one or more problems set forth above and other problems in the art.

BRIEF SUMMARY OF THE DISCLOSURE

One aspect of the present disclosure includes a forming method of a semiconductor device. The forming method includes forming an initial dummy gate structure on a substrate. The initial dummy gate structure extends along a first direction. The forming method also includes forming a source/drain doped layer in the substrate on two sides of the initial dummy gate structure, and after forming the source/drain doped layer, forming an initial conductive layer on the source/drain doped layer. The initial conductive layer covers a sidewall and a top surface of the source/drain doped layer. The forming method also includes, after forming the initial conductive layer, removing the initial dummy gate structure.

Optionally, the initial dummy gate structure includes a dummy gate dielectric layer, a dummy gate layer on the dummy gate dielectric layer, and a first protection layer on the dummy gate layer.

Optionally, after forming the initial dummy gate structure, and before forming the source/drain doped layer, the forming methods also includes forming a sidewall spacer on the substrate. The sidewall spacer is located on a sidewall of the initial dummy gate structure.

Optionally, after forming the initial conductive layer, and before removing the initial dummy gate structure, the forming method also includes forming a dielectric layer on the substrate. The dielectric layer covers a sidewall of the initial dummy gate structure and a sidewall of the initial conductive layer.

Optionally, the forming method also includes forming a first opening between adjacent initial conductive layers, and after forming the first opening, forming an initial gate structure in the first opening.

Optionally, the initial gate structure includes a gate dielectric layer, a gate electrode layer on the gate dielectric layer, and a second protection layer on the gate electrode layer.

Optionally, after forming the initial gate structure, the forming method also includes etching away a portion of the initial conductive layer, thus forming a conductive layer and a first isolation opening in the dielectric layer. The first isolation opening passes through the conductive layer along a second direction, and the first direction is perpendicular to the second direction. The forming method also includes forming a first isolation structure in the first isolation opening.

Optionally, after forming the initial gate structure, the forming method also includes etching away a portion of the initial gate structure, thus forming a gate structure and a second isolation opening in the dielectric layer. The second isolation opening passes through the gate structure along the second direction. The forming method also includes forming a second isolation structure in the second isolation opening.

Optionally, after forming the gate structure and the conductive layer, the forming method also includes forming a first conductive plug and a second conductive plug. The first conductive plug is in contact with the gate structure, and the second conductive plug is in contact with the conductive layer.

Optionally, the gate structure includes a first region and a second region arranged along the first direction, the conductive layer is located on two sides of the first region of the gate structure, the first conductive plug is in contact with the first region of the gate structure, and the second conductive plug is in contact with the conductive layer.

Optionally, the second conductive plug is located on a top surface of a portion of the gate structure, and the second conductive plug is in contact with the sidewall spacer.

Optionally, the initial conductive layer includes a contact layer on an exposed surface of the source/drain doped layer, and a metal layer on the contact layer.

Optionally, the initial conductive layer also includes a third protective layer on the metal layer.

Optionally, a process of forming the contact layer includes forming an initial contact layer on the exposed surface of the source/drain doped layer, and annealing the initial contact layer, thereby forming the contact layer.

Optionally, a process of annealing the initial contact layer includes an annealing time in a range of approximately 5 s to 30 s, and an annealing temperature in a range of approximately 600° C. to 1000° C.

Another aspect of the present disclosure includes a semiconductor device. The semiconductor structure includes a substrate and a gate structure located on the substrate. The gate structure extends along the first direction. The semiconductor structure also includes a source/drain doped layer in the substrate located on two sides of the gate structure, and a conductive layer on the source/drain doped layer. The conductive layer covers a sidewall and a top surface of the source/drain doped layer.

Optionally, the gate structure includes a gate dielectric layer, a gate electrode layer on the gate dielectric layer, and a second protection layer on the gate electrode layer.

Optionally, the semiconductor structure also includes a first conductive plug and a second conductive plug. The first conductive plug is in contact with the gate structure, and the second conductive plug is in contact with the conductive layer.

Optionally, the gate structure includes a first region and a second region arranged along the first direction. The conductive layer is located on two sides of the first region of the gate structure, the first conductive plug is in contact with the first region of the gate structure, and the second conductive plug is in contact with the conductive layer.

Optionally, the second conductive plug is located on a top surface of a portion of the gate structure, and the second conductive plug is in contact with a sidewall spacer located on a sidewall of the gate structure.

Optionally, the semiconductor structure also includes a dielectric layer located on the substrate. The dielectric layer covers a sidewall of the conductive layer and a sidewall of the gate structure. The semiconductor structure also includes a first isolation structure and a second isolation structure located in the dielectric layer. The first isolation structure is in contact with the sidewall of the gate structure, and the second isolation structure is in contact with the sidewall of the conductive layer.

Optionally, the conductive layer includes a contact layer on an exposed surface of the source/drain doped layer, and a metal layer on the contact layer.

Optionally, the conductive layer also includes a third protective layer on the metal layer.

Optionally, the first conductive plug is located on a top surface of a portion of the conductive layer, and the first conductive plug is in contact with the third protective layer.

Optionally, the contact layer is made of a material including silicon titanide, silicon nickel, silicon cobalt, or a combination thereof.

As disclosed, the technical solutions of the present disclosure have the following advantages.

In the forming method provided by the present disclosure, after forming the source/drain doped layer and before removing the initial dummy gate structure, an initial conductive layer is directly formed on the source/drain doped layer. As such, a process of forming a dielectric layer first and then etching the dielectric layer to form an opening may be avoided. Accordingly, the manufacturing process may be simplified, and the manufacturing cost and the manufacturing cycle may be decreased. In addition, since the initial conductive layer is formed directly on the source/drain doped layer, the initial conductive layer formed may cover the sidewall and the top surface of the source/drain doped layer. As such, a contact area between the initial conductive layer and the source/drain doped layer may be increased. Accordingly, contact resistance between the initial conductive layer and the source/drain doped layer may be reduced, and performance of the semiconductor structure finally formed may thus be improved.

Further, the second conductive plug is located on a top surface of a portion of the gate structure, and the second conductive plug is in contact with the sidewall spacer. Accordingly, the second conductive plug formed is a self-aligned structure. As such, in a process of forming the second conductive plug, an accuracy requirement of an opening of the photomask may be simplified, and processing difficulty may thus be reduced.

Further, the gate structure includes a first region and a second region arranged along the first direction. The conductive layer is located on two sides of the first region of the gate structure. The first conductive plug is in contact with the first region of the gate structure, and the second conductive plug is in contact with the conductive layer. Accordingly, distance between the first conductive plug and the second conductive plug may be reduced. As such, an integration level of elements of the semiconductor structure finally formed may be improved.

In the semiconductor device provided by the present disclosure, the conductive layer on the source/drain doped layer covers the sidewall and the top surface of the source/drain doped layer. Accordingly, the contact area between the conductive layer and the source/drain doped layer may be increased. As such, contact resistance between the conductive layer and the source/drain doped layer may be reduced, and performance of the semiconductor structure finally formed may thus be improved.

Further, the second conductive plug is located on a top surface of a portion of the gate structure, and the second conductive plug is in contact with the sidewall spacer. Accordingly, the second conductive plug formed is a self-aligned structure. As such, in a process of forming the second conductive plug, an accuracy requirement of an opening of the photomask may be simplified, and processing difficulty may thus be reduced.

Further, the gate structure includes a first region and a second region arranged along the first direction. The conductive layer is located on two sides of the first region of the gate structure. The first conductive plug is in contact with the first region of the gate structure, and the second conductive plug is in contact with the conductive layer. Accordingly, distance between the first conductive plug and the second conductive plug may be reduced. As such, an integration level of elements of the semiconductor structure finally formed may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that, in the present disclosure, the terms "surface" and "upper" are used to describe relative positional relationships in space, and are not limited to as direct contact.

Figure 1:
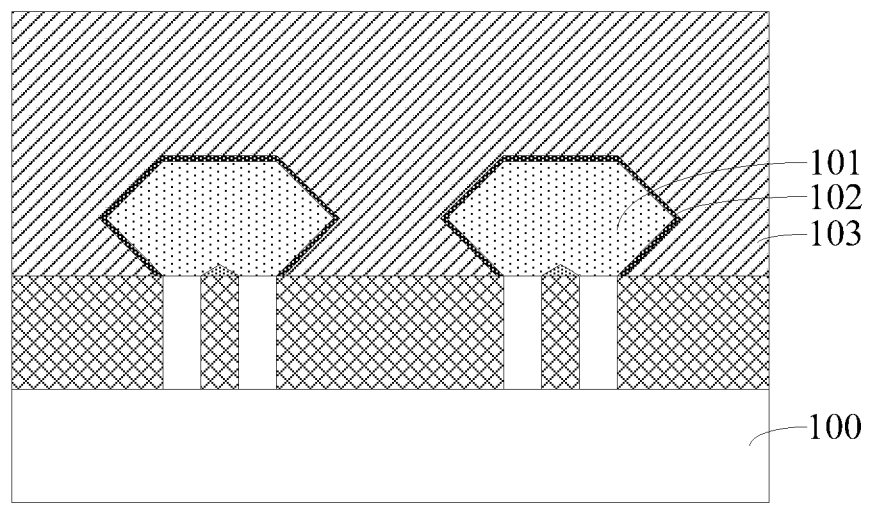
FIG. 1 and FIG. 2 illustrate structural diagrams of a semiconductor device.
Figure 2:
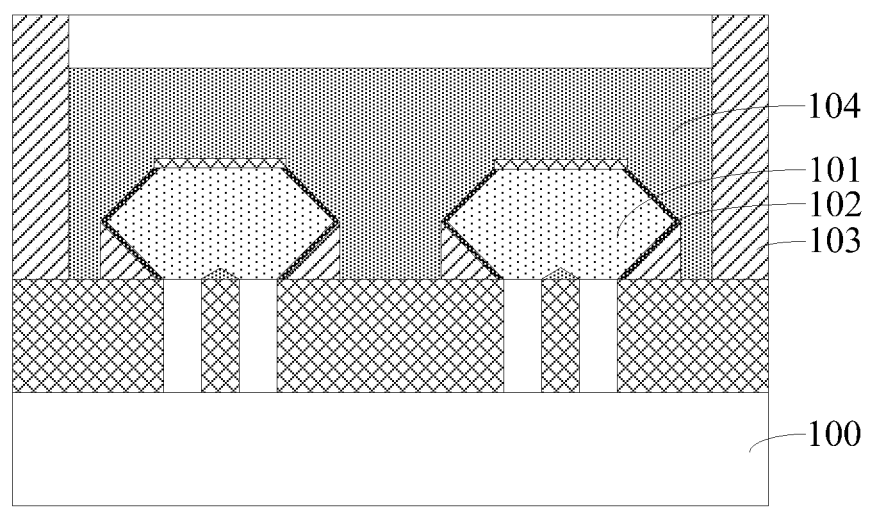

FIG. 1 and FIG. 2 illustrate structural diagrams of a semiconductor device. Referring to FIG. 1, a forming method of the semiconductor device includes providing a substrate 100 and forming a dummy gate structure (not shown) on the substrate 100. The dummy gate structure extends along a first direction. The method also includes forming a source/drain doped layer 101 in the substrate 100 on two sides of the dummy gate structure, and after the source/drain doped layer 101 is formed, forming an etch stop layer 102. The etch stop layer 102 covers a sidewall and a top surface of the source/drain doped layer 101. The method also includes forming a dielectric layer 103 on the substrate 100. The dielectric layer 103 covers sidewalls of the etch stop layer 102 and the dummy gate structure.

Referring to FIG. 2, after the dielectric layer 103 is formed, the dielectric layer 103 and the etch stop layer 102 are etched until a top surface of the source/drain doped layer 101 is exposed, thus forming an opening (not labeled) in the dielectric layer 103. A conductive layer 104 is formed in the opening. The conductive layer 104 is located on the top surface of the source/drain doped layer 101.

In the method described above, the etch stop layer 102 and the dielectric layer 103 are formed on the source/drain doped layer 101 first. After the etch stop layer 102 and the dielectric layer 103 are formed, the dielectric layer 103 and the etch stop layer 102 are etched and removed to form the opening. The conductive layer 104 is then formed in the opening.

In the method described above, the dielectric layer 103 is formed first, and after the dielectric layer 103 is formed, the dielectric layer 103 is etched to form the opening. However, the process of forming the conductive layer 104 in the opening may be cumbersome and complicated. Accordingly, the production cycle and the production cost may be increased. In addition, when etching the dielectric layer 103, the dielectric layer 103 covered by a portion of a sidewall of the source/drain doped layer 101 may be difficult to be etched completely. Accordingly, the surface of the source/drain doped layer 101 may not be completely exposed, and thus the conductive layer 104 subsequently formed may only contact the top surface and a portion of a sidewall surface of the source/drain doped layer 101. As such, a contact area between the conductive layer 104 and the source/drain doped layer 101 may be reduced, and thus contact resistance between the conductive layer 104 and the source/drain doped layer 101 may increase. As a result, performance of the semiconductor structure finally formed may be affected.

The present disclosure provides a semiconductor structure and a forming method of the semiconductor structure. An initial dummy gate structure is formed on a substrate, and a source/drain doped layer is formed in the substrate on two sides of the initial dummy gate structure. An initial conductive layer is formed on the source/drain doped layer, and the initial conductive layer covers a sidewall and a top surface of the source/drain doped layer. The initial dummy gate structure is removed. After forming the source/drain doped layer, the initial conductive layer is directly formed on the source/drain doped layer. As such, a process of forming a dielectric layer first and then etching the dielectric layer to form an opening may be avoided. Accordingly, the manufacturing process may be simplified, and the manufacturing cost and the manufacturing cycle may be decreased. In addition, since the initial conductive layer is formed directly on the source/drain doped layer, the initial conductive layer formed may cover the sidewall and the top surface of the source/drain doped layer. As such, a contact area between the initial conductive layer and the source/drain doped layer may be increased. Accordingly, contact resistance between the initial conductive layer and the source/drain doped layer may be reduced, and performance of the semiconductor structure finally formed may be improved.

As disclosed, after forming the source/drain doped layer, an initial conductive layer is directly formed on the source/drain doped layer, and a subsequent process of etching the dielectric layer and forming the etching stop layer may thus be avoided. Accordingly, the production process may be simplified, and the production cost and the production cycle may be reduced. In addition, the initial conductive layer formed may cover the sidewall and the top surface of the source/drain doped layer, effectively increasing the contact area between the initial conductive layer and the source/drain doped layer. Accordingly, the contact resistance between the initial conductive layer and the source/drain doped layers may be reduced, and thus performance of the semiconductor structure finally formed may be improved.

Figure 15:
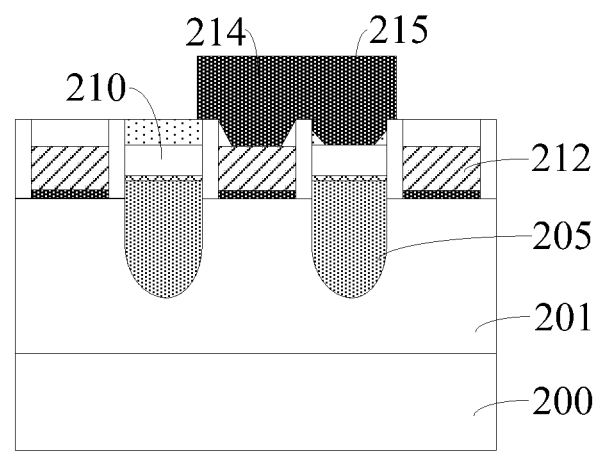
Figure 16:
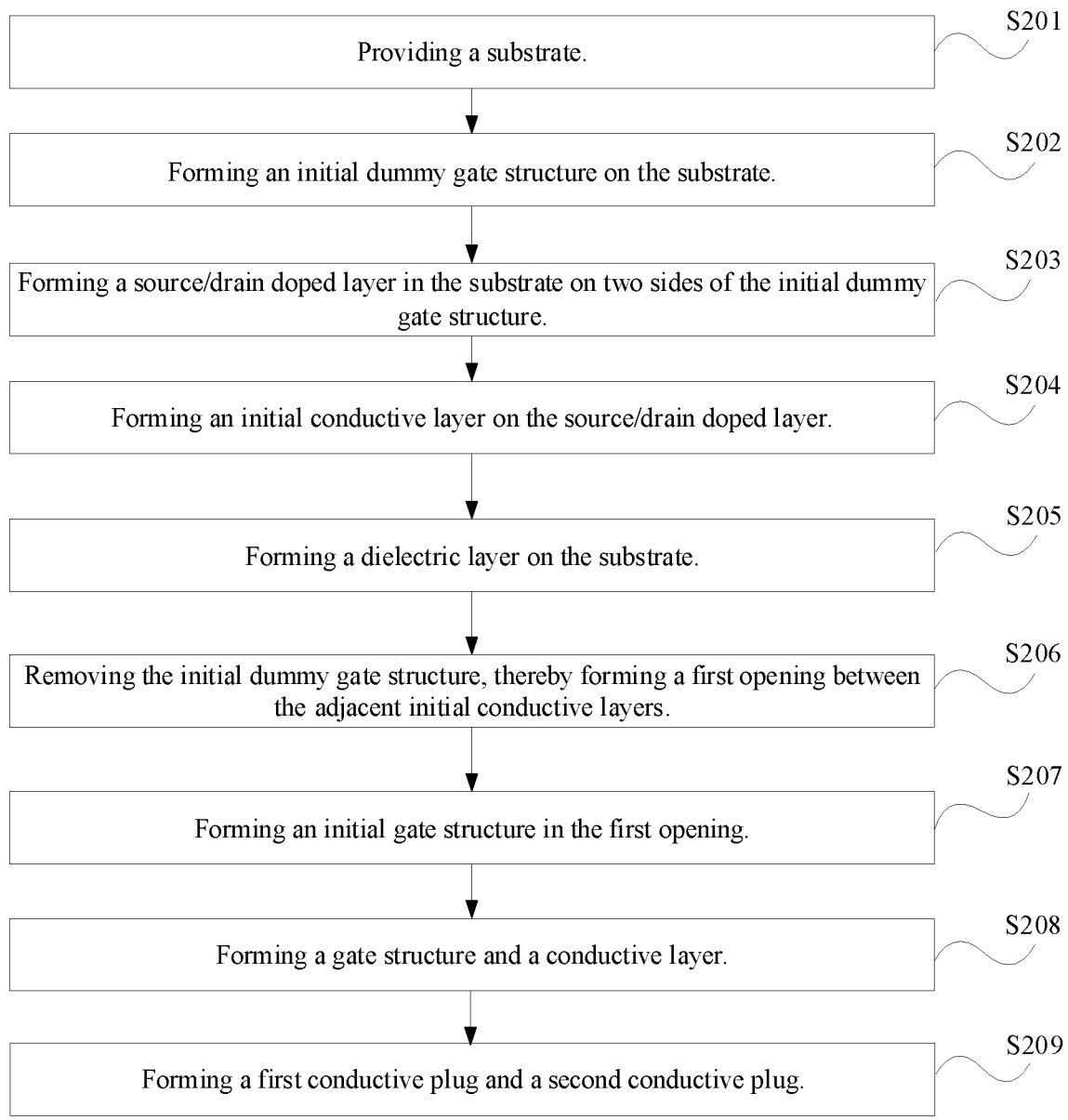
FIG. 16 illustrates a flowchart of an exemplary forming method of a semiconductor device, consistent with the disclosed embodiments of the present disclosure.

FIG. 16 illustrates a flowchart of an exemplary forming method of a semiconductor device, consistent with the disclosed embodiments of the present disclosure. FIGS. 3 to 15 illustrate semiconductor structures corresponding to certain stages of the exemplary forming method of the semiconductor device.

Figure 3:
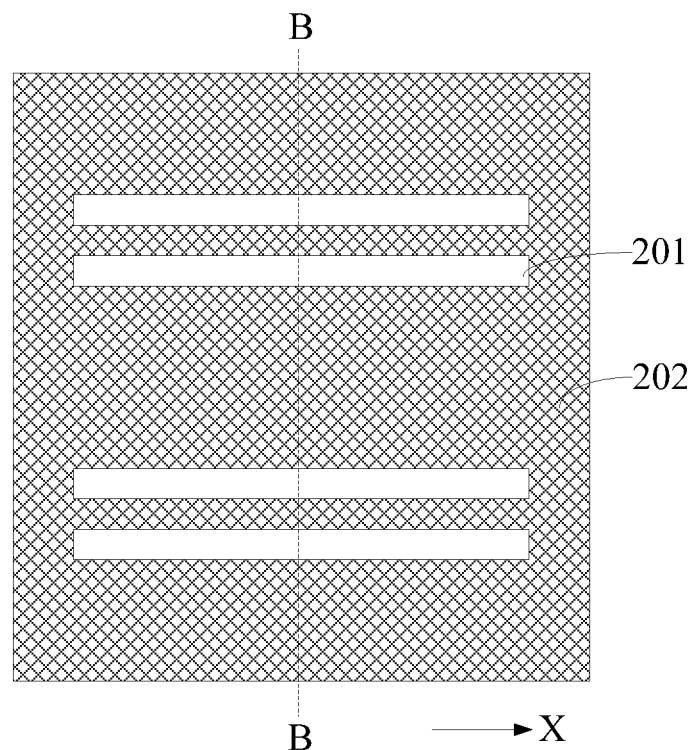
FIGS. 3 to 15 illustrate semiconductor structures corresponding to certain stages of an exemplary forming method of a semiconductor device, consistent with the disclosed embodiments of the present disclosure.
Figure 4:
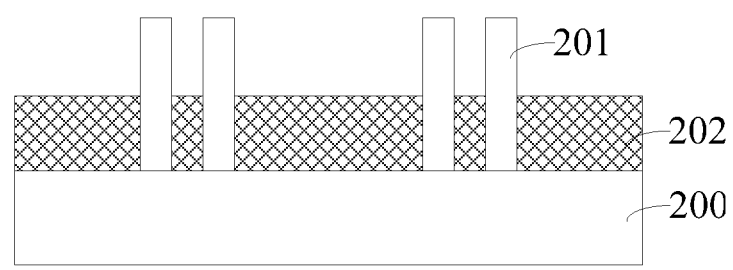

As shown in FIG. 16, at the beginning of the forming method, a substrate is provided (S201). FIGS. 3 and 4 illustrates a corresponding semiconductor structure. FIG. 4 is a cross-sectional view along line B-B in FIG. 3.

As shown in FIGS. 3 and 4, a substrate is provided. In one embodiment, the substrate includes a base 200 and a plurality of fins 201 on the base 200. Fins of the plurality of fins 201 are discrete from each other, and extend along a second direction X.

In one embodiment, a process of forming the base 200 and the plurality of fins 201 includes providing an initial substrate (not shown), patterning and etching the initial substrate, thus forming the base 200 and the plurality of fins 201 on the base 200.

In one embodiment, the base 200 is made of silicon. In some other embodiments, the base may be made of a material including germanium, silicon germanium, silicon carbide, gallium arsenide, indium gallium, or a combination thereof.

In one embodiment, the plurality of fins 201 is made of silicon. In another embodiment, the plurality of fins 201 may be made of a material including germanium, silicon germanium, silicon carbide, gallium arsenide, indium gallium, or a combination thereof.

Still referring to FIG. 4, an isolation layer 202 may be formed on the substrate. The isolation layer 202 covers a portion of a sidewall of the fin 201.

A forming process of the isolation layer 202 includes forming an initial isolation layer (not shown) on the substrate 200, and removing a portion of the initial isolation layer by etching to form the isolation layer 202. A top surface of the isolation layer 202 is lower than a top surface of the fin 201.

The isolation layer 202 is made of an insulating material. The insulating material may include silicon oxide or silicon oxynitride. In one embodiment, the isolation layer 202 is made of silicon oxide.

Figure 5:
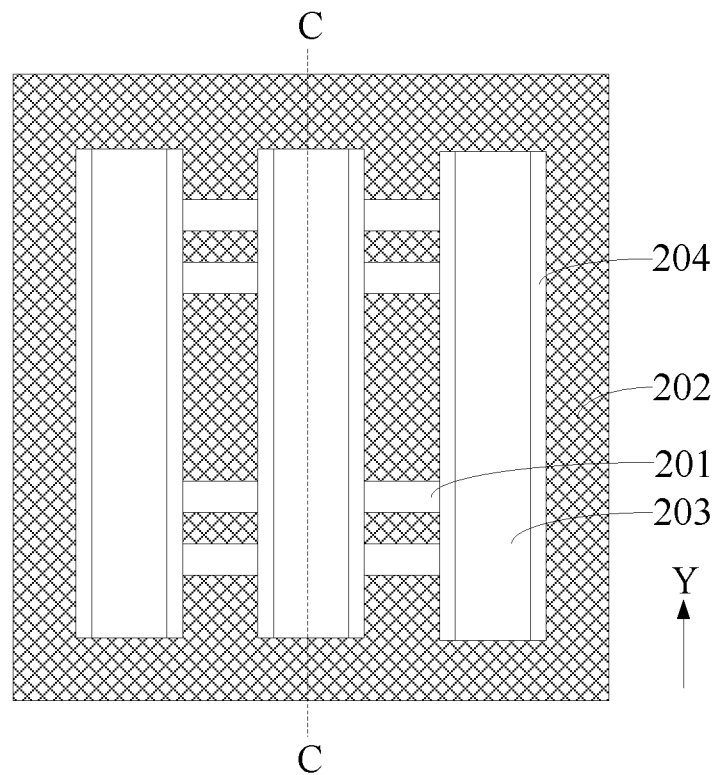
Figure 6:
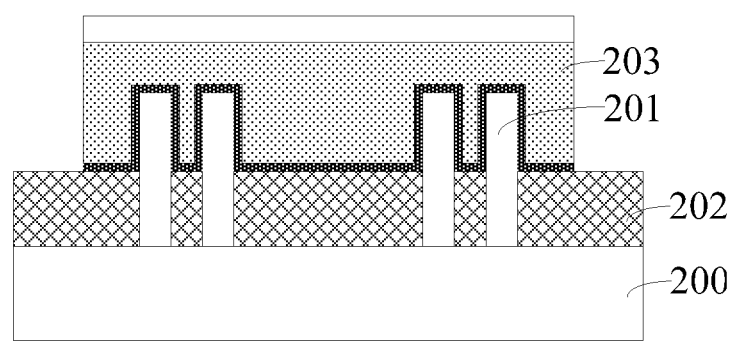

Returning to FIG. 16, after providing the substrate, an initial dummy gate structure may be formed on the substrate (S202). FIGS. 5 and 6 illustrate a corresponding semiconductor structure. FIG. 6 is a cross-sectional view along line C-C in FIG. 5.

Referring to FIGS. 5 and 6, an initial dummy gate structure 203 is formed on the substrate. The initial dummy gate structure 203 extends along the first direction Y. In one embodiment, the first direction Y is perpendicular to the second direction X. The initial dummy gate structure 203 spans the fin 201, and the initial dummy gate structure 203 covers a portion of a sidewall and a top surface of the fin 201.

In one embodiment, the initial dummy gate structure 203 includes a dummy gate dielectric layer, a dummy gate layer on the dummy gate dielectric layer, and a first protection layer on the dummy gate layer.

In one embodiment, the dummy gate dielectric layer is made of a material including a high-K dielectric material. The dummy gate layer is made of a material including polysilicon or amorphous silicon. In one embodiment, the first protective layer is made of silicon nitride.

Still referring to FIG. 5, after the initial dummy gate structure 203 is formed, a sidewall spacer 204 is formed on the substrate. The sidewall spacer 204 is located on a sidewall of the initial dummy gate structure 203. The sidewall spacer 204 is made of a material including silicon nitride, silicon oxide, silicon oxynitride, or a combination thereof. In one embodiment, the sidewall spacer 204 is made of silicon nitride.

Figure 7:
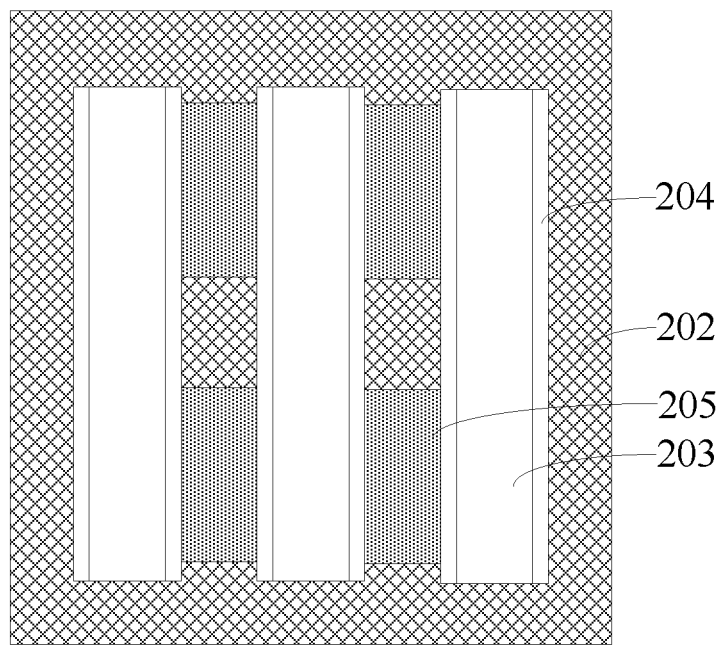

Returning to FIG. 16, after forming the initial dummy gate structure, a source/drain doped layer may be formed in the substrate on two sides of the initial dummy gate structure (S203). FIG. 7 illustrates a corresponding semiconductor structure. View directions of FIG. 7 and FIG. 5 are same.

Referring to FIG. 7, a source/drain doped layer 205 is formed in the substrate on two sides of the initial dummy gate structure 203.

In one embodiment, a process of forming the source/drain doped layer 205 includes etching the fin 201 with the initial dummy gate structure 203 and the sidewall spacer 204 as a mask, thus forming a source/drain opening (not shown) in the fin 201. The process also includes using an epitaxial growth process to form an epitaxial layer (not shown) in the source/drain opening. The process also includes in-situ doping of the epitaxial layer during the epitaxial growth. Source/drain ions are doped into the epitaxial layer to form the source/drain doped layer 205.

In one embodiment, a top or a sidewall of the source/drain doped layer 205 protrudes from the surface of the fin 201.

Figure 8:
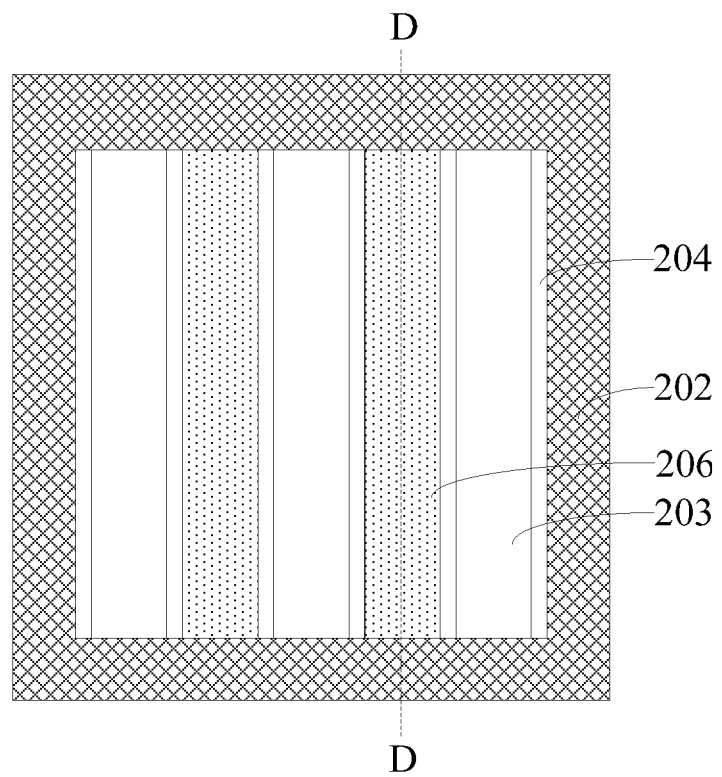
Figure 9:
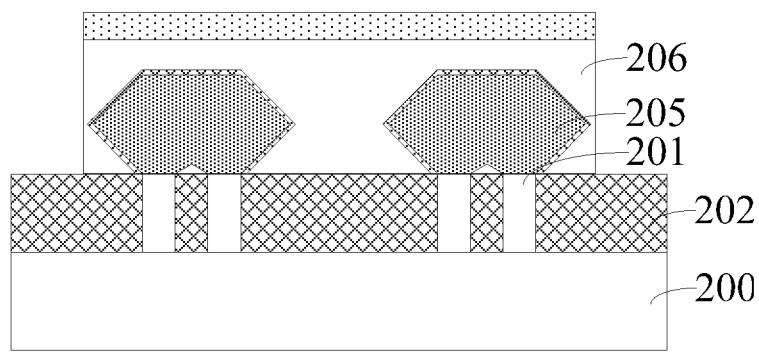

Returning to FIG. 16, after forming the source/drain doped layer, an initial conductive layer may be formed on the source/drain doped layer (S204). FIGS. 8 and 9 illustrate a corresponding semiconductor structure. FIG. 9 is a cross-sectional view along line D-D in FIG. 8.

Referring to FIGS. 8 and 9, after the source/drain doped layer 205 is formed, an initial conductive layer 206 is formed on the source/drain doped layer 205. The initial conductive layer 206 covers a sidewall and a top surface of the source/drain doped layer 205.

In the present disclosure, after forming the source/drain doped layer 205 and before removing the initial dummy gate structure 203, an initial conductive layer 206 is directly formed on the source/drain doped layer 205. As such, a process of forming a dielectric layer first and then etching the dielectric layer to form an opening may be avoided. Accordingly, the manufacturing process may be simplified, and the manufacturing cost and the manufacturing cycle may be decreased. In addition, since the initial conductive layer 206 is formed directly on the source/drain doped layer 205, the initial conductive layer 206 formed may cover the sidewall and the top surface of the source/drain doped layer 205. As such, a contact area between the initial conductive layer 206 and the source/drain doped layer 205 may be increased. Accordingly, contact resistance between the initial conductive layer 206 and the source/drain doped layer 205 may be reduced, and performance of the semiconductor structure finally formed may thus be improved.

In one embodiment, the initial conductive layer 206 includes a contact layer on an exposed surface of the source/drain doped layer 205, a metal layer on the contact layer, and a third protective layer on the metal layer.

In one embodiment, a function of the contact layer includes reducing the contact resistance between the metal layer and the source/drain doped layer 205. A process of forming the contact layer includes forming an initial contact layer (not shown) on the exposed surface of the source/drain doped layer 205, and annealing the initial contact layer to form the contact layer. In one embodiment, an annealing process includes an annealing time of approximately 5 s to 30 s, and an annealing temperature of approximately 600° C. to 1000° C.

Figure 10:
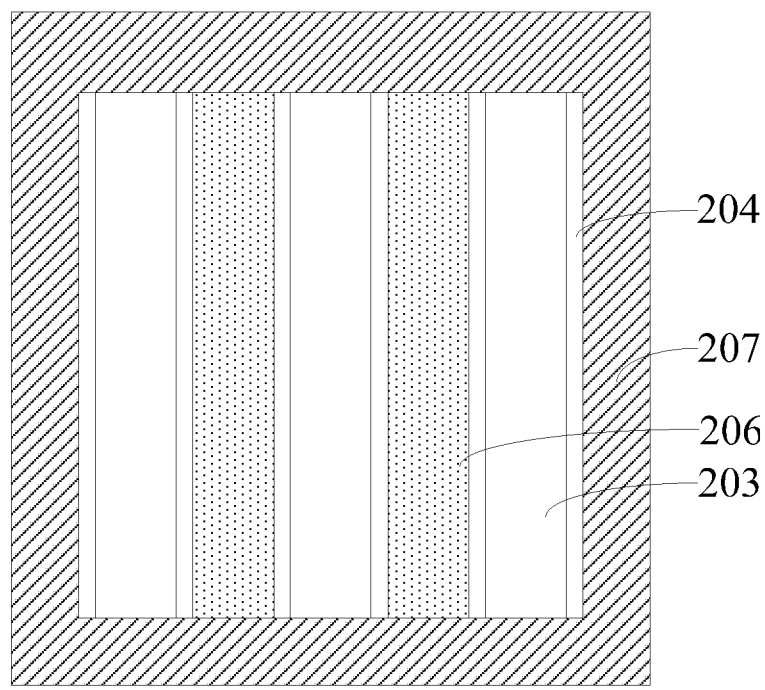

Returning to FIG. 16, after forming the initial conductive layer, a dielectric layer may be formed on the substrate (S205). FIG. 10 illustrates a corresponding semiconductor structure. View directions of FIG. 10 and FIG. 8 are same.

Referring to FIG. 10, after forming the initial conductive layer 206, a dielectric layer 207 is formed on the substrate. The dielectric layer 207 covers sidewalls of the initial dummy gate structure 203 and the initial conductive layer 206.

In one embodiment, a process of forming the dielectric layer 207 includes forming an initial dielectric layer (not shown) on the isolation layer 202. The initial dielectric layer covers the initial conductive layer 206 and the initial dummy gate structure 203. The process also includes planarizing the initial dielectric layer until the top surfaces of the initial dummy gate structure 203 and the initial conductive layer 206 are exposed, thus forming the dielectric layer 207.

In one embodiment, the dielectric layer 207 is made of silicon oxide. In some other embodiments, the dielectric layer may be made of a low-K dielectric material (e.g., a low-K dielectric material refers to a dielectric material with a relative permittivity lower than approximately 3.9) or an ultra-low-K dielectric material (e.g., an ultra-low-K dielectric material refers to a dielectric material with a relative permittivity lower than approximately 2.5).

Figure 11:
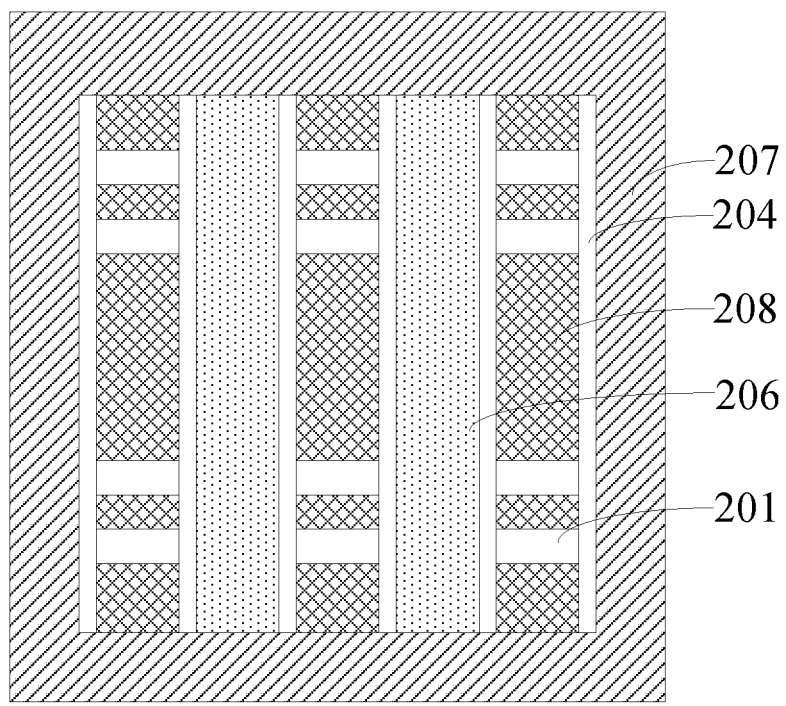

Returning to FIG. 16, after forming the dielectric layer, the initial dummy gate structure 203 may be removed, and a first opening may thus be formed between the adjacent initial conductive layers (S206). FIG. 11 illustrates a corresponding semiconductor structure.

Referring to FIG. 11, after the dielectric layer 207 is formed, the initial dummy gate structure 203 is removed, and a first opening 208 is formed between the adjacent initial conductive layers 206. In one embodiment, the first opening 208 may be used to provide space for subsequently forming a gate structure.

In one embodiment, a process of removing the initial dummy gate structure 203 may include a wet etching process. In some other embodiments, the process of removing the initial dummy gate structure may include a dry etching process.

Figure 12:
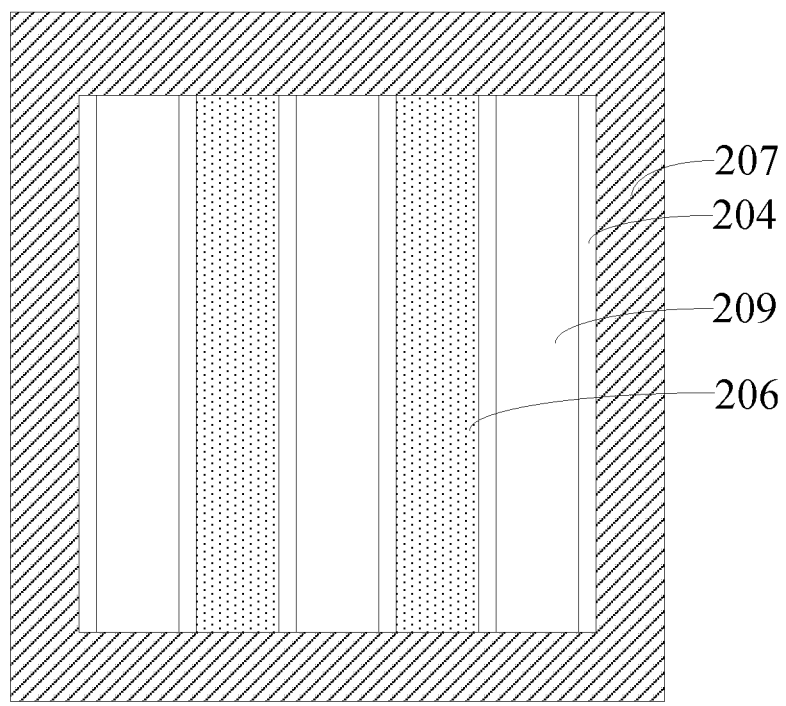

Returning to FIG. 16, after forming the first opening, an initial gate structure may be formed in the first opening (S207). FIG. 12 illustrates a corresponding semiconductor structure.

Referring to FIG. 12, after the first opening 208 is formed, an initial gate structure 209 is formed in the first opening 208. In one embodiment, the initial gate structure 209 includes a gate dielectric layer, a gate electrode layer on the gate dielectric layer, and a second protection layer on the gate electrode layer.

In one embodiment, the gate dielectric layer is made of a material including a high-K dielectric material.

In one embodiment, the gate electrode layer is made of a metal material. The metal material may include tungsten, aluminum, copper, titanium, silver, gold, lead, nickel, or a combination thereof. In one embodiment, the gate electrode layer is made of tungsten.

In one embodiment, the second protection layer is made of silicon nitride.

Figure 13:
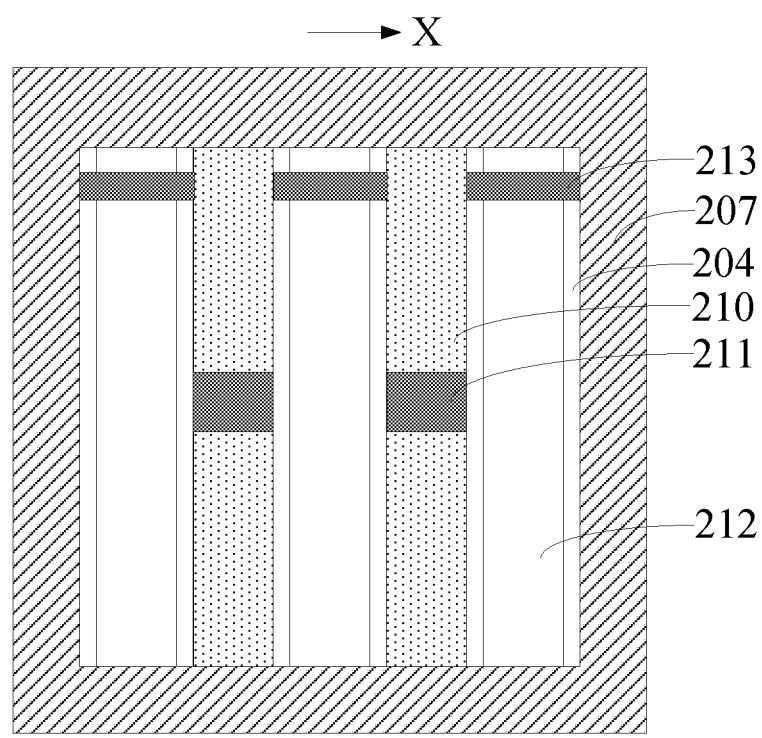

Returning to FIG. 16, after forming the initial gate structure, a gate structure and a conductive layer may be formed (S208). FIG. 13 illustrates a corresponding semiconductor structure.

Referring to FIG. 13, after the initial gate structure 209 is formed, a portion of the initial conductive layer 206 is etched away to form a conductive layer 210 and a first isolation opening (not labeled) in the dielectric layer 207. The first isolation opening passes through the conductive layer 210 along the second direction X. A first isolation structure 211 is formed in the first isolation opening. A portion of the initial gate structure 209 is removed by etching to form a gate structure 212 and a second isolation opening (not labeled) in the dielectric layer 207. The second isolation opening passes through the gate structure along the second direction X. A second isolation structure 213 is formed in the second isolation opening.

In one embodiment, the initial gate structure 209 and the initial conductive layer 206 may be etched simultaneously using a same photomask. In some other embodiments, the initial gate structure and the initial conductive layer may be etched using different photomasks in different processes.

The first isolation structure 211 and the second isolation structure 213 may be used to realize electrical isolation and insulation to avoid short-circuiting between adjacent gate structures 212 and between adjacent conductive layers 210.

In one embodiment, the first isolation structure 211 and the second isolation structure 213 are made of silicon oxide.

Figure 14:
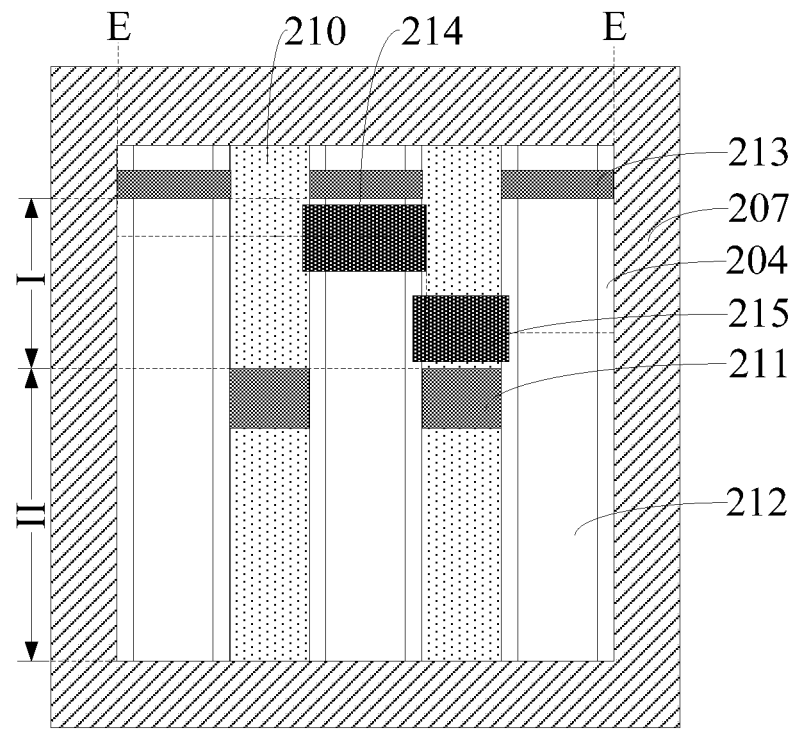

Returning to FIG. 16, after forming the gate structure and the conductive layer, a first conductive plug and a second conductive plug may be formed (S209). FIGS. 14 and 15 illustrate a corresponding semiconductor structure. FIG. 15 is a cross-sectional view along line E-E in FIG. 14.

Referring to FIGS. 14 and 15, after forming the gate structure 212 and the conductive layer 210, a first conductive plug 214 and a second conductive plug 215 are formed. The first conductive plug 214 is in contact with the gate structure 212, and the second conductive plug 215 is in contact with the conductive layer 210.

In one embodiment, the gate structure 212 includes a first region I and a second region II arranged along the first direction Y. The conductive layer 210 is located on two sides of the first region I of the gate structure 212. The first conductive plug 214 is in contact with the first region I of the gate structure 212, and the second conductive plug 215 is in contact with the conductive layer 210.

Since the first conductive plug 214 is contact with the first region I of the gate structure 212, and the second conductive plug 215 is in contact with the conductive layer 210, distance between the first conductive plug 214 and the second conductive plug 215 may be reduced. Accordingly, an integration level of elements of the semiconductor structure finally formed may be improved.

In one embodiment, the second conductive plug 215 is located on a portion of the top surface of the gate structure 212, and the second conductive plug 215 is in contact with the sidewall spacer 204.

Since the second conductive plug 215 is located on a portion of the top surface of the gate structure 212, and the second conductive plug 215 is in contact with the sidewall spacer 204, the second conductive plug 215 formed is a self-aligned structure. Accordingly, in a process of forming the second conductive plug 215, an accuracy requirement of an opening of the photomask may be reduced, and processing difficulty may be reduced.

The first conductive plug 214 and the second conductive plug 215 are made of metal materials. The metal materials include tungsten, aluminum, copper, titanium, silver, gold, lead, or nickel. In one embodiment, the first conductive plug 214 and the second conductive plug 215 are made of tungsten.

The present disclosure also provides a semiconductor structure. Referring to FIGS. 14 and 15, the semiconductor structure includes a substrate and a gate structure 212 located on the substrate. The gate structure 212 extends along the first direction Y. The semiconductor structure also includes a source/drain doped layer 205 in the substrate located on two sides of the gate structure 212, and a conductive layer 210 on the source/drain doped layer 205. The conductive layer 210 covers a sidewall and a top surface of the source/drain doped layer 205. The semiconductor structure also includes a dielectric layer 207 located on the substrate. The dielectric layer 207 covers sidewalls of the conductive layer 210 and the gate structure 212.

Since the conductive layer 210 on the source/drain doped layer 205 covers the sidewall and the top surface of the source/drain doped layer 205, the contact area between the conductive layer 210 and the source/drain doped layer 205 may be increased. Accordingly, contact resistance between the conductive layer 210 and the source/drain doped layer 205 may be reduced, and performance of the semiconductor structure finally formed may thus be improved.

In one embodiment, the gate structure 212 includes a gate dielectric layer, a gate electrode layer on the gate dielectric layer, and a second protection layer on the gate electrode layer.

In one embodiment, the semiconductor device also includes a sidewall spacer 204 located on the sidewall of the gate structure 212.

In one embodiment, the semiconductor device also includes a first conductive plug 214 and a second conductive plug 215. The first conductive plug 214 is in contact with the gate structure 212, and the second conductive plug 215 is in contact with the conductive layer 210.

In one embodiment, the gate structure 212 includes a first region I and a second region II arranged along the first direction Y. The conductive layer 210 is located on two sides of the first region I of the gate structure 212. The first conductive plug 214 is in contact with the first region I of the gate structure 210. The second conductive plug 215 is in contact with the conductive layer 210.

Since the first conductive plug 214 is in contact with the first region I of the gate structure 212, and the second conductive plug 215 is in contact with the conductive layer 210, distance between the first conductive plug 214 and the second conductive plug 215 may be reduced. Accordingly, an integration level of elements of the semiconductor structure finally formed may be improved.

In one embodiment, the second conductive plug 215 is located on a portion of the top surface of the gate structure 212, and the second conductive plug 215 is in contact with the sidewall spacer 204.

Since the second conductive plug 215 is located on a portion of the top surface of the gate structure 212, and the second conductive plug 215 is in contact with the sidewall spacer 204, the second conductive plug 215 formed is a self-aligned structure. Accordingly, in a process of forming the second conductive plug 215, an accuracy requirement of an opening of the photomask may be reduced, and processing difficulty may be reduced.

In one embodiment, the semiconductor device also includes a first isolation structure 211 and a second isolation structure 213 located in the dielectric layer 207. The first isolation structure 211 is in contact with the sidewall of the gate structure 212, and the second isolation structure 213 is in contact with the sidewall of the conductive layer 210.

In one embodiment, the substrate includes a base 200 and a plurality of separate fins 201 on the base 200. A fin 201 of the plurality of separate fins 201 extends along a second direction X. The first direction Y is perpendicular to the second direction X. The gate structure 212 spans the fin 201, and the gate structure 212 covers a portion of the sidewalls and top surfaces of the fins 201. The source/drain doped layer 205 is located in the fin 201 on two sides of the gate structure 212.

In one embodiment, a top or a sidewall of the source/drain doped layer 205 protrudes from a surface of the fin 201.

In one embodiment, the semiconductor structure also includes an isolation layer 202 on the substrate. The isolation layer 202 covers a portion of the sidewall of the fin 201, and the gate structure 212 is located on the isolation layer 202.

In one embodiment, the conductive layer 210 includes a contact layer on an exposed surface of the source/drain doped layer 205, and a metal layer on the contact layer.

In one embodiment, the conductive layer also includes a third protective layer on the metal layer.

In one embodiment, the first conductive plug 214 is located on a portion of the top surface of the conductive layer 210, and the first conductive plug 214 is in contact with the third protective layer.

In one embodiment, the contact layer is made of silicon titanide. In some other embodiments, the contact layer may be made of silicon nickel or silicon cobalt.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method of forming a semiconductor device, comprising:
   forming an initial dummy gate structure on a substrate, wherein the initial dummy gate structure extends along a first direction;
   after forming the initial dummy gate structure, forming a sidewall spacer on the substrate, wherein the sidewall spacer is located on a sidewall of the initial dummy gate structure;
   after forming the sidewall spacer, forming a source/drain doped layer in the substrate on two sides of the initial dummy gate structure;
   forming an initial conductive layer on the source/drain doped layer and covering a sidewall and a top surface of the source/drain doped layer;
   after forming the initial conductive layer, removing the initial dummy gate structure and forming a first opening between two adjacent portions of the initial conductive layer;
   forming an initial gate structure in the first opening;
   after forming the initial gate structure, removing an additional portion of the initial conductive layer, thereby forming a conductive layer and a first isolation opening, wherein the first isolation opening passes through the conductive layer along a second direction, and the first direction is perpendicular to the second direction; and
   forming a first isolation structure in the first isolation opening.

2. The method according to claim 1, wherein the initial dummy gate structure includes:
   a dummy gate dielectric layer;
   a dummy gate layer on the dummy gate dielectric layer; and
   a protection layer on the dummy gate layer.

3. The method according to claim 1, after forming the initial conductive layer, and before removing the initial dummy gate structure, further comprising:
   forming a dielectric layer on the substrate, wherein the dielectric layer covers a sidewall of the sidewall spacer and a sidewall of the initial conductive layer.

4. The method according to claim 1, wherein the initial gate structure includes:
   a gate dielectric layer;
   a gate electrode layer on the gate dielectric layer; and
   a protection layer on the gate electrode layer.

5. The method according to claim 1, after forming the initial gate structure, further comprising:
   removing a portion of the initial gate structure, thereby forming a gate structure and a second isolation opening, wherein the second isolation opening passes through the gate structure along the second direction; and
   forming a second isolation structure in the second isolation opening.

6. The method according to claim 5, after forming the gate structure and the conductive layer, further comprising:
   forming a first conductive plug and a second conductive plug, wherein:
   the first conductive plug is in contact with the gate structure; and
   the second conductive plug is in contact with the conductive layer.

7. The method according to claim 6, wherein:
   the gate structure includes a first region and a second region arranged along the first direction;
   the conductive layer is located on two sides of the first region of the gate structure;
   the first conductive plug is in contact with the first region of the gate structure; and
   the second conductive plug is in contact with the conductive layer.

8. The method according to claim 6, wherein:
   the second conductive plug is located on a top surface of a portion of the gate structure; and the second conductive plug is in contact with the sidewall spacer.

9. The method according to claim 1, wherein the initial conductive layer includes:
- a contact layer on an exposed surface of the source/drain doped layer;
- a metal layer on the contact layer; and
- a protective layer on the metal layer.

10. The method according to claim 9, wherein a process of forming the contact layer includes:
- forming an initial contact layer on the exposed surface of the source/drain doped layer; and
- annealing the initial contact layer, thereby forming the contact layer.

11. The method according to claim 10, wherein a process of annealing the initial contact layer includes:
- an annealing time in a range of approximately 5 seconds to 30 seconds; and
- an annealing temperature in a range of approximately 600° C. to 1000° C.

\* \* \* \* \*